United States Patent [19]
Chen et al.

[11] Patent Number: 5,942,785
[45] Date of Patent: Aug. 24, 1999

[54] POLY PLUG TO REDUCE BURIED CONTACT SERIES RESISTANCE

[75] Inventors: Chan Yuan Chen; Shih Bin Peng, both of Hsin-Chu, Taiwan

[73] Assignee: Taiwan Semiconductor Manufacturing Company, Ltd., Hsin-Chu, Taiwan

[21] Appl. No.: 08/837,487

[22] Filed: Apr. 18, 1997

Related U.S. Application Data

[62] Division of application No. 08/705,453, Aug. 29, 1996, Pat. No. 5,668,051.

[51] Int. Cl.⁶ .................................................. H01L 29/76
[52] U.S. Cl. ........................... 257/382; 257/381; 257/384; 257/385
[58] Field of Search ..................................... 257/382, 381, 257/385, 213, 384

[56] References Cited

U.S. PATENT DOCUMENTS 5,049,518  9/1991  Fuse et al. .................................. 437/52
5,742,088  4/1998  Pan et al. .................................. 257/382

*Primary Examiner*—Carl Whitehead, Jr.
*Attorney, Agent, or Firm*—George O. Saile; Stephen B. Ackerman; Rosemary L. S. Pike

[57] ABSTRACT

An integrated circuit device having a reduced buried contact resistance is achieved. A gate electrode lies on the surface of a semiconductor substrate. Source/drain regions within the semiconductor substrate surround the gate electrode. A polysilicon contact lies on the surface of the semiconductor substrate. A buried contact junction underlies the polysilicon contact and adjoins one of the source/drain regions. A doped polysilicon layer partially fills a trench in the semiconductor substrate at the junction between the buried contact junction and one of the source/drain regions wherein the doped polysilicon layer provides a conduction channel between the source/drain region and the adjoining buried contact junction.

4 Claims, 4 Drawing Sheets

POLY PLUG TO REDUCE BURIED CONTACT SERIES RESISTANCE

This application is a divisional of 08/705,453 filed Aug. 29, 1996 now U.S. Pat. No. 5,668,051.

BACKGROUND OF THE INVENTION (1) Field of the Invention

The invention relates to the fabrication of integrated circuit devices, and more particularly, to a method of reduced buried contact resistance in the fabrication of integrated circuits.

(2) Description of the Prior Art

Referring to FIG. 1, a typical buried contact is formed by depositing a doped layer of polysilicon 14 over and on the planned buried contact regions in a semiconductor substrate 10 and heating the structure. The buried contact regions 16 are doped by outdiffusion of dopants from the doped polysilicon layer into the silicon substrate. The doped polysilicon layer 14 is allowed to remain on the buried contact regions as their contacts. Gate electrodes 18 and source and drain regions 20 are formed in and on the semiconductor substrate. One of the source/drain regions 20 contacts the buried contact region 16. The desired current path is from the polysilicon layer 14 through the buried contact region 16 to source/drain region 20, as illustrated by 30.

If there is misalignment of the mask during etching of the polysilicon 18, the resistance of the buried contact will be increased. If the mask is shifted to the left, as shown in FIG. 2, a portion of the semiconductor substrate within the buried contact area will be exposed. During polysilicon overetching, a buried contact trench 22 will be etched.

In this case, the current path 31 goes from the polysilicon 14 through the buried contact 16, then around the trench 22, filled with an extension of the insulating sidewall and finally to the source/drain region 20. The area around the trench 22 is N− because the N− dopant, for an NLDD MOSFET structure, is implanted before the sidewall formation. Since N− is resistive rather than conductive, resistance is increased, leading to decreased device performance.

Co-pending U.S. patent application Ser. No. 08/405719 (TSMC94-044) to H. W. Chin filed on Mar. 17, 1994 teaches a method using an inverse tone of the buried contact mask to make a photoresist mask covering the buried junction area and adding an additional bias on either side of the mask to protect the buried junction area during overetch so that a misalignment of the mask will not cause the formation of a buried contact trench. Co-pending U.S. patent application Ser. No. 08/488,764 (TSMC94-054) to J. M. Huang filed on Jun. 8, 1995 uses a high dielectric constant spacer material for the LDD spacer to provide better immunity of the buried contact trench. Co-pending U.S. patent application Ser. No. 08/503,173 (TSMC94-084) also to J. M. Huang filed on Jul. 7, 1995 teaches linking the buried contact junction and the source junction by an extra high dose N+ implant to overcome the disadvantages of a buried contact trench.

SUMMARY OF THE INVENTION

A principal object of the present invention is to provide an effective and very manufacturable method of forming buried contact junctions with reduced buried contact resistance.

Another object of the present invention is to provide a method of forming buried contact junctions with reduced buried contact resistance which will not be harmed by mask misalignment.

In accordance with the objects of this invention a new method of forming improved buried contact junctions is achieved. A layer of gate silicon oxide is provided over the surface of a semiconductor substrate. A first layer of polysilicon is deposited overlying the gate silicon oxide layer. The first polysilicon layer and the gate oxide layer are etched away where they are not covered by a mask to provide an opening to the semiconductor substrate where the planned buried contact junction will be formed. A second polysilicon layer is deposited overlying the first polysilicon layer and the planned buried contact junction. The second polysilicon layer is doped. A polycide layer is deposited overlying the second polysilicon layer. Dopant is outdiffused from second polysilicon layer to form the buried contact junction. The polycide and the second polysilicon layers are etched away where they are not covered by a mask to provide a polysilicon contact overlying the buried contact junction and providing an opening to the semiconductor substrate where a planned source/drain region will be formed wherein the planned source/drain region is adjacent to the buried contact junction and wherein a portion of the second polysilicon layer not at the polysilicon contact remains as residue. The residue is etched away whereby a trench is etched into the semiconductor substrate at the junction of the planned source/drain region and the buried contact junction. A doped third polysilicon layer is deposited overlying the polysilicon contact and within the trench. The doped third polysilicon layer is etched away leaving the doped third polysilicon layer only on the sidewall of the polysilicon contact and within the trench. Ions are implanted to form the planned source/drain region wherein a conduction channel is provided between the source/drain region and the buried contact junction completing the formation of a buried contact junction in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
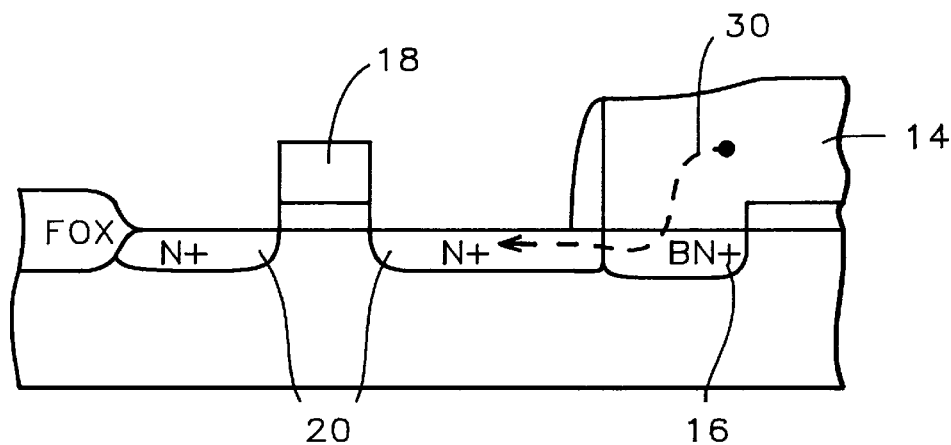
FIGS. 1 and 2 schematically illustrate in cross-sectional representation an embodiment of the prior art.
Figure 2:
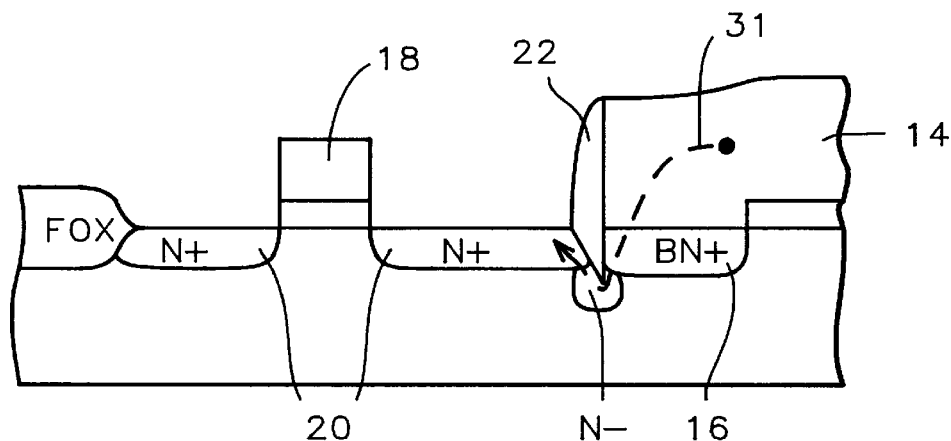

Referring to FIGS. 3 through 9, a preferred embodiment of the present invention will be described. Note that the drawing figures illustrate an N channel MOSFET integrated circuit device. However, it is well understood by those skilled in the art that a P channel FET integrated circuit device could be formed by simply substituting opposite polarities to those given for the N channel embodiment. Also, in a similar way, a CMOSFET could be formed by making both N channel and P channel devices upon the same substrate.

Figure 3:
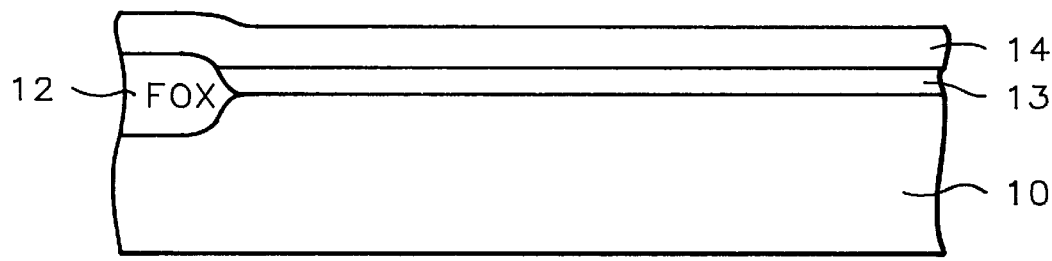
FIGS. 3 through 9 schematically illustrate in cross-sectional representation a preferred embodiment of the present invention.

Referring now more particularly to FIG. 3, there is shown a portion of a partially completed integrated circuit. There is shown a monocrystalline semiconductor substrate 10 in which there are formed field oxide regions 12. A gate oxide layer 13 is grown on the surface of the semiconductor substrate, typically to a thickness of between about 70 to 100 Angstroms. The polysilicon layer 14 is blanket deposited such as by low pressure chemical vapor deposition (LPCVD) to a thickness of between about 500 to 550 Angstroms.

Figure 4:
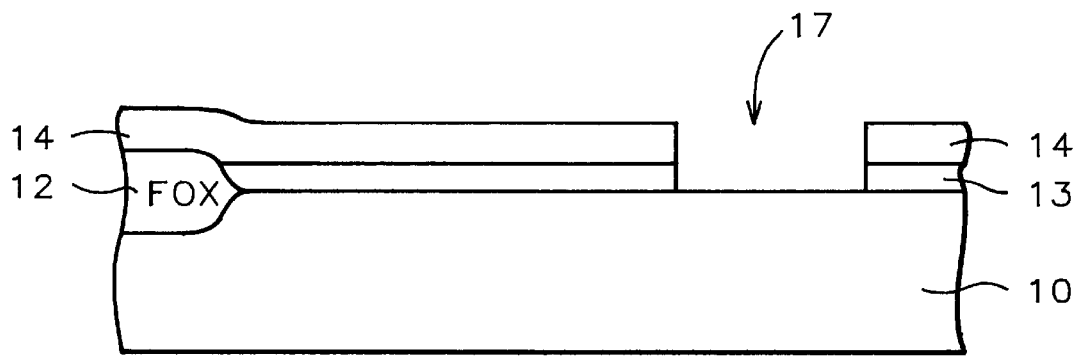

A buried contact mask is used to make a photoresist mask overlying the polysilicon layer 14. The polysilicon and gate oxide layers are etched away where they are not covered by the mask to form the buried contact opening 17, as shown in FIG. 4. While a single thick polysilicon layer is an acceptable alternative, a split polysilicon process is preferred and will be described herein.

Figure 5:
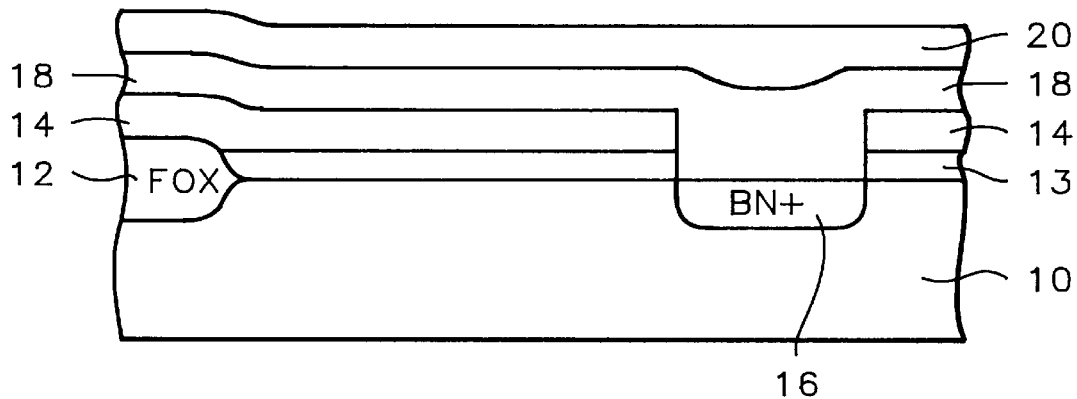

Referring now to FIG. 5, a second layer of polysilicon 18 is deposited by LPCVD to a thickness of between about 1000 to 1250 Angstroms. The buried contact is formed either by diffusion of $POCl_3$ or by ion implanting the top polysilicon layer 18. For example, arsenic or phosphorus ions are implanted with a dosage of between about 1 E 15 to 3 E 15 atoms/cm$^2$. Alternatively, the polysilicon layer 18 could be in-situ doped.

The dopants are driven into the silicon substrate at a temperature of between about 750 to 850° C. to form buried junction 16.

After drive-in, a polycide layer 20 may be deposited over the polysilicon layer 18, typically by chemical vapor deposition. This layer may be a tungsten silicide, titanium silicide, or the like having a thickness of between about 1000 to 1500 Angstroms.

Figure 6:
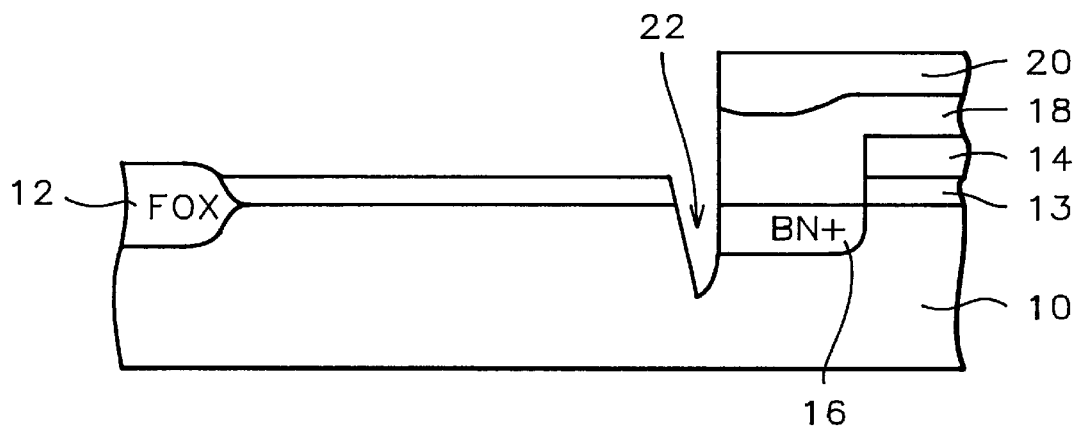
Figure 7:
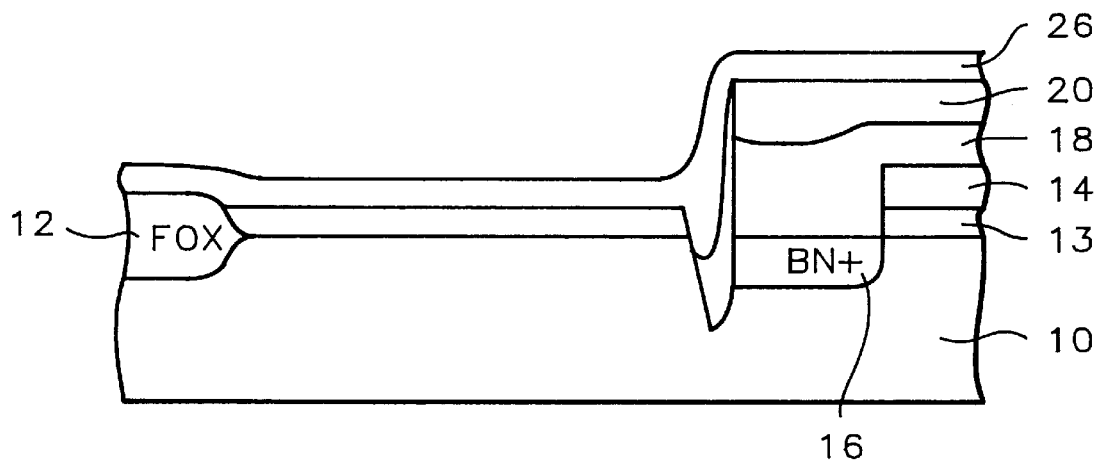

The main polysilicon etch, the results of which are illustrated in FIG. 6, is typically a dry etch with an etch stop at the gate silicon oxide layer 13.

In the FIGS. 6 through 9, the photomask has been slightly misaligned so that a portion of the semiconductor substrate containing the buried junction is exposed. During overetching to remove polysilicon residue, a buried contact trench 22 is etched into the semiconductor substrate.

At this point, the key steps of the present invention to reduce buried contact resistance will be described. The goal is to link up the buried junction and the source/drain junction without increasing resistance.

A thin layer of polysilicon 26 is deposited over the surface of the substrate and within the buried contact trench. The polysilicon is deposited by LPCVD to a thickness of between about 500 to 550 Angstroms. The polysilicon 26 is doped by diffusion of $POCl_3$ or is in-situ doped with phosphorus.

Figure 8:
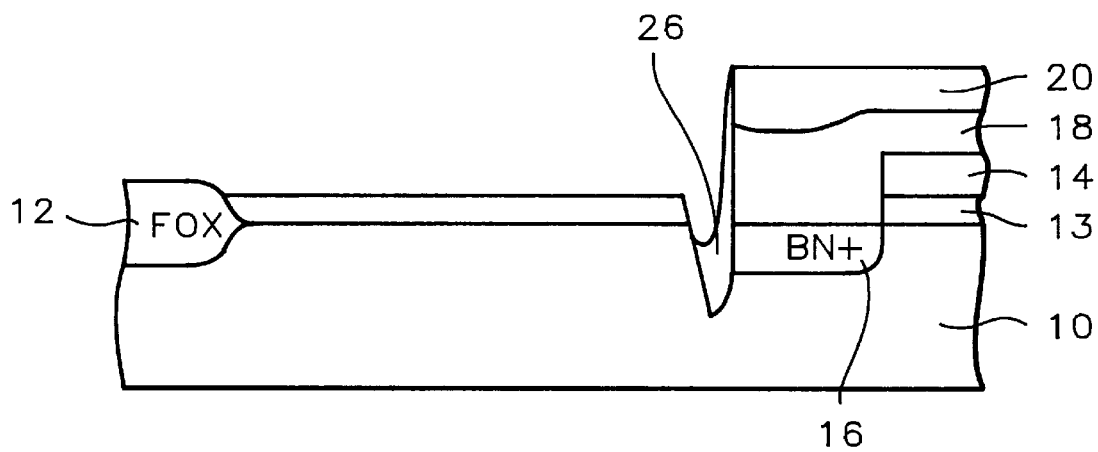

Referring now to FIG. 8, the polysilicon layer 26 is etched by a dry etch with an etch stop at the gate silicon oxide layer 13 and the polycide surface. The polysilicon layer 26 remaining after etching is within the trench 22 and on the sidewall of the polysilicon layers 14 and 18 and polycide layer 20.

The polysilicon 26 within the trench provides a conduction path between the buried contact junction and the source/drain region to be formed later. The doping of the polysilicon 26 further provides low resistance. The doped polysilicon material 26 is preferred for good interconnection between the silicon substrate and the polysilicon 14 and 18 and for low resistance for the current path.

Figure 9:
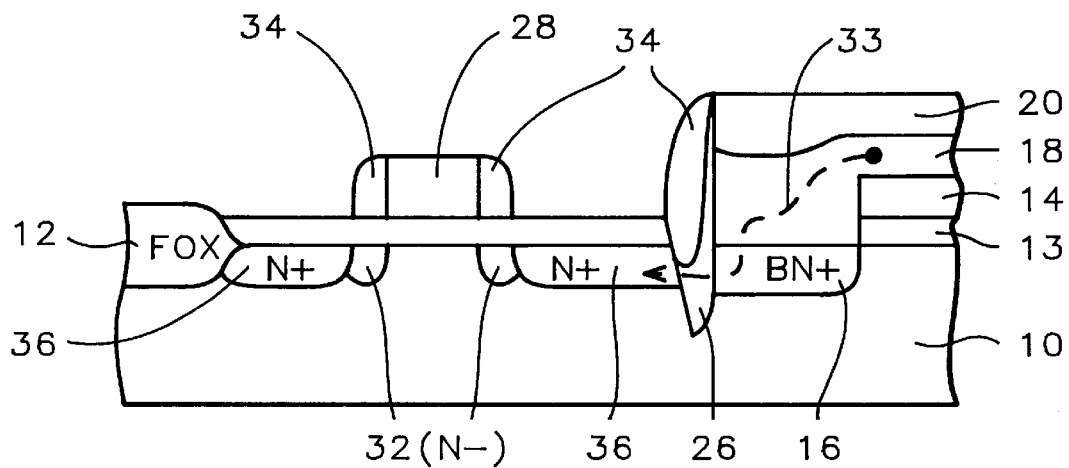

Gate electrode 28 is formed as is conventional in the art, as shown in FIG. 9. Lightly doped source and drain regions 32 are formed, followed by oxide deposition and etching to form spacers 34 on the sidewalls of the gate electrode and the polysilicon/polycide structure 14,18,20.

The substrate is again masked for the source/drain implantation. Ions are implanted into the substrate where it is not covered by a mask to form source and drain regions 36. The presence of the doped polysilicon material 26 within the trench 22 provides a conduction path for the current flow. As illustrated by 33, the current flows from the polysilicon 14 through the buried contact junction 16, through the low resistance polysilicon material 26, to the source/drain region 36.

Figure 10:
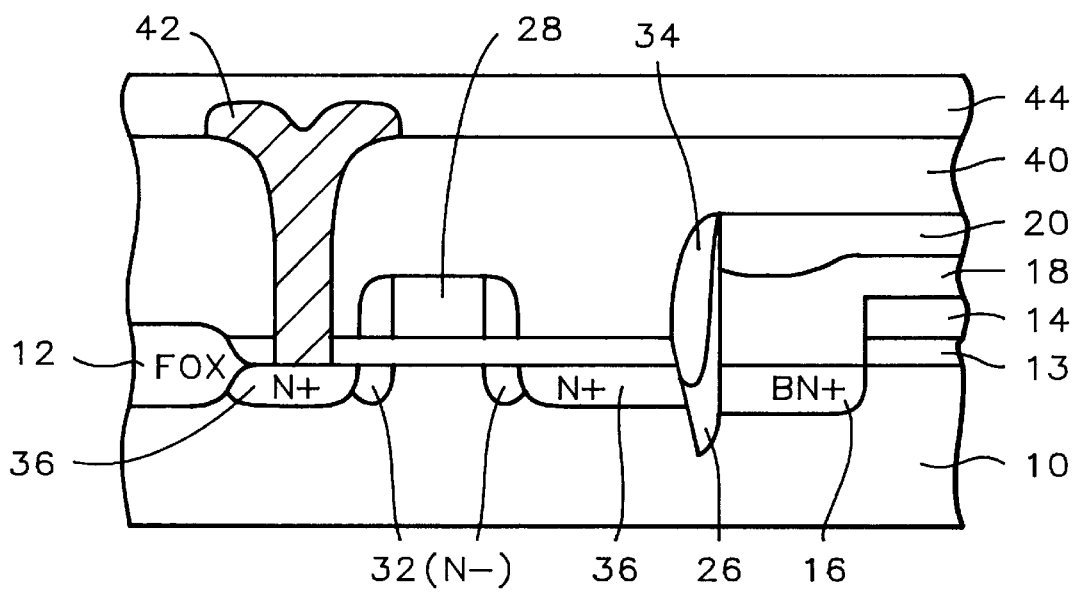
FIG. 10 schematically illustrates in cross-sectional representation a completed integrated circuit device fabricated according to the process of the present invention.

Processing continues as is conventional in the art to complete the integrated circuit device. For example, as illustrated in FIG. 10, a thick insulating layer 40 has been coated over the surface of the substrate. This layer may be composed of silicon dioxide and/or borophosphosilicate glass, for example. Openings are etched through the thick insulating layer 40 where electrical connections are to be made. A conducting layer 42, such as aluminum is deposited into the openings and patterned to complete electrical connections such as to source/drain region 36. Passivation or intermetal dielectric layer 44 is deposited over the patterned metal layer.

The process of the invention provides for the formation of buried contact junctions having reduced buried contact resistance. The process of the invention also provides for a low resistance current path from a polysilicon region through a buried contact region to a source/drain region regardless of mask misalignment.

While the invention has been particularly shown and described with reference to the preferred embodiments thereof, it will be understood by those skilled in the art that various changes in form and details may be made without departing from the spirit and scope of the invention.

What is claimed is:

1. An integrated circuit device having a conduction channel between a source/drain region and an adjoining buried contact junction comprising:

a gate electrode on the surface of a semiconductor substrate;

source/drain regions within said semiconductor substrate surrounding said gate electrode;

a polysilicon contact on the surface of said semiconductor substrate;

a buried contact junction underlying said polysilicon contact and adjoining one of said source/drain regions; and a doped polysilicon layer partially filling a trench in said semiconductor substrate at the junction between said buried contact junction and one of said source/drain regions wherein said doped polysilicon layer provides said conduction channel between said source/drain region and said adjoining buried contact junction.

2. The device according to claim 1 wherein said doped polysilicon layer is doped with phosphorus.

3. An integrated circuit device having a conduction channel between a source/drain region and an adjoining buried contact junction comprising:

a gate electrode on the surface of a semiconductor substrate;

source/drain regions within said semiconductor substrate surrounding said gate electrode;

a polysilicon contact on the surface of said semiconductor substrate;

a buried contact junction underlying said polysilicon contact and adjoining one of said source/drain regions; and a doped polysilicon layer on the sidewalls of said gate electrode and partially filling a trench in said semiconductor substrate at the junction between said buried contact junction and one of said source/drain regions and underlying said polysilicon contact wherein said doped polysilicon layer provides said conduction channel between said source/drain region and said adjoining buried contact junction.

4. The device according to claim 3 wherein said doped polysilicon layer is doped with phosphorus.

* * * * *